US011844253B2

(12) United States Patent
Feng et al.

(10) Patent No.: US 11,844,253 B2
(45) Date of Patent: Dec. 12, 2023

(54) DISPLAY PANEL, DISPLAY DEVICE

(71) Applicants:Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/922,456

(22) PCT Filed: Nov. 19, 2021

(86) PCT No.: PCT/CN2021/131682
§ 371 (c)(1),
(2) Date: Oct. 31, 2022

(87) PCT Pub. No.: WO2022/222459
PCT Pub. Date: Oct. 27, 2022

(65) Prior Publication Data
US 2023/0247872 A1    Aug. 3, 2023

(30) Foreign Application Priority Data
Apr. 19, 2021    (CN) .......................... 202110419358.8

(51) Int. Cl.
*H10K 59/131*    (2023.01)
*H10K 59/126*    (2023.01)
(Continued)

(52) U.S. Cl.
CPC ......... *H10K 59/131* (2023.02); *G09G 3/3266* (2013.01); *G11C 19/287* (2013.01);
(Continued)

(58) Field of Classification Search
None
See application file for complete search history.

(56) References Cited

U.S. PATENT DOCUMENTS

| 2011/0128461 A1* | 6/2011 | Koyama | ............... G02F 1/1368 |
| | | | 349/42 |
| 2017/0076664 A1* | 3/2017 | Nakagawa | ........... G09G 3/3648 |

FOREIGN PATENT DOCUMENTS

| CN | 206627737 U | 11/2017 |
| CN | 108389549 A | 8/2018 |

(Continued)

OTHER PUBLICATIONS

International Search Report dated Feb. 15, 2022 in corresponding International Patent Application No. PCT/CN2021/131682 (with English translation).

(Continued)

*Primary Examiner* — Stephen T. Reed
(74) *Attorney, Agent, or Firm* — XSENSUS LLP

(57) ABSTRACT

The present disclosure provides a display panel and a display device. The display panel includes a gate driving circuit including a first transistor; a base substrate; a functional layer located on a side of the base substrate, a material of the functional layer is a thermal conductive material, and the functional layer includes a first functional portion; an active layer located on a side of the functional layer away from the base substrate, the active layer includes a first active portion including at least one first active sub-portion which is configured to form a channel region of the first transistor; a second conductive layer located on a side of the active layer away from the base substrate, the second conductive layer includes a first conductive portion connected to the first functional portion through a first via hole.

18 Claims, 6 Drawing Sheets

(51) Int. Cl.
  *H10K 59/80* (2023.01)
  *G09G 3/3266* (2016.01)
  *G11C 19/28* (2006.01)

(52) U.S. Cl.
  CPC ....... *H10K 59/126* (2023.02); *H10K 59/8794* (2023.02); *G09G 2300/0426* (2013.01); *G09G 2310/0286* (2013.01)

(56) References Cited

FOREIGN PATENT DOCUMENTS

| | | | |
|---|---|---|---|
| CN | 109962078 | A | 7/2019 |
| CN | 108389549 | B | 9/2019 |
| CN | 111415995 | A | 7/2020 |
| CN | 111725250 | A | 9/2020 |
| CN | 109962078 | B | 2/2021 |
| CN | 112597844 | A | 4/2021 |
| CN | 113140607 | A | 7/2021 |
| JP | 2005215354 | A | 8/2005 |
| JP | 4507611 | B2 | 7/2010 |

OTHER PUBLICATIONS

Written Opinion of the International Searching Authority dated Feb. 15, 2022 in corresponding International Patent Application No. PCT/CN2021/131682 (with English translation), 3 pages.
Chinese First Office Action dated Apr. 14, 2022 in corresponding Chinese Patent Application No. 202110419358.8 (with English translation), 15 pages.
Chinese Notice of Allowance dated Aug. 24, 2022 in corresponding Chinese Patent Application No. 202110419358.8 (with English translation), 7 pages.

* cited by examiner

DISPLAY PANEL, DISPLAY DEVICE

CROSS-REFERENCE

The present disclosure is a U.S. National Stage of International Application No. PCT/CN2021/131682, filed on Nov. 19, 2021, which claims priority to Chinese patent application No. 202110419358.8, entitled "DISPLAY PANEL AND DISPLAY APPARATUS", filed on Apr. 19, 2021, the entire content of which is incorporated herein by reference.

TECHNICAL FIELD

The present disclosure relates to a display technical field, and more particularly, to a display panel and a display device.

BACKGROUND

A display panel includes a plurality of transistors. When a turned-on current of a transistor is excessively large, the display panel is prone to be damaged due to heat accumulation.

It should be noted that the information disclosed in the above BACKGROUND section is only for enhancing the understanding of the background of the present disclosure, and thus may include information that does not constitute the prior art known to those of ordinary skill in the art.

SUMMARY

According to an aspect of the present disclosure, a display panel is provided. The display panel includes: a gate driving circuit. wherein the gate driving circuit includes a plurality of shift register units that are cascaded, the shift register unit includes a first transistor, and the display panel further includes: a base substrate; a functional layer located on a side of the base substrate, wherein a material of the functional layer is a thermal conductive material, and the functional layer includes a first functional portion; an active layer located on a side of the functional layer away from the base substrate, wherein the active layer includes a first active portion, the first active portion includes at least one first active sub-portion, and the first active sub-portion is configured to form a channel region of the first transistor; a second conductive layer located on a side of the active layer away from the base substrate, wherein the second conductive layer includes a first conductive portion, and the first conductive portion is connected to a first electrode of the first transistor and connected to the first functional portion through a first via hole.

In an exemplary embodiment of the present disclosure, the material of the functional layer is a light shielding material; an orthographic projection of the first functional portion on the base substrate covers an orthographic projection of the first active sub-portion on the base substrate.

In an exemplary embodiment of the present disclosure, the active layer may include a plurality of the first active portions, orthographic projections of the plurality of the first active portions on the base substrate are arranged at intervals along the first direction, and the first active sub-portions in different first active portions are connected in parallel in a circuit where the first transistor is located.

In an exemplary embodiment of the present disclosure, the first active portion further includes at least one second active sub-portion and at least one third active sub-portion, and the second active sub-portion is connected to the third active sub-portion adjacent to the second active sub-portion through the at least one first active sub-portion; the display panel further includes a first conductive layer located between the active layer and the second conductive layer, wherein the first conductive layer includes: at least one first signal line electrically connected to each other, wherein the first signal line and the first active sub-portion are arranged in one-to-one correspondence, an orthographic projection of the first signal line on the base substrate covers an orthographic projection of the first active sub-portion corresponding to the first signal line on the base substrate, and at least partial structure of each first signal line is configured to form the gate of the first transistor; the first conductive portion includes: at least one second signal line electrically connected to each other, wherein the second signal line and the second active sub-portion are arranged in one-to-one correspondence, an orthographic projection of the second signal line on the base substrate covers an orthographic projection of the second active sub-portion corresponding to the second signal line on the base substrate, and the second signal line is connected to the second active sub-portion corresponding to the second signal line through at least one second via hole; the second conductive layer further includes: at least one third signal line electrically connected to each other, wherein the third signal line and the third active sub-portion are arranged in one-to-one correspondence, an orthographic projection of the third signal line on the base substrate covers an orthographic projection of the third active sub-portion corresponding to the third signal line on the base substrate, and the third signal line is connected to the third active sub-portion corresponding to the third signal line through at least one third via hole.

In an exemplary embodiment of the present disclosure, the first active portion includes a plurality of the first active sub-portions.

In an exemplary embodiment of the present disclosure, the first active portion includes four first active sub-portions, two second active sub-portions, and three third active sub-portions; the third active sub-portion, the first active sub-portion, the second active sub-portion, the first active sub-portion, the third active sub-portion, the first active sub-portion, the second active sub-portion, the first active sub-portion, and the third active sub-portion are sequentially connected.

In an exemplary embodiment of the present disclosure, the orthographic projection of the second signal line on the base substrate and the orthographic projection of the third signal line on the base substrate extend in a first direction; the second signal line is connected to the second active sub-portion corresponding to the second signal line through a plurality of second via holes, and orthographic projections of the plurality of second via holes on the base substrate are arranged at intervals along the first direction; the third signal line is connected to the third active sub-portion corresponding to the third signal line through a plurality of third via holes, and orthographic projections of the plurality of third via holes on the base substrate are arranged at intervals along the first direction.

In an exemplary embodiment of the present disclosure, each of the orthographic projection of the first signal line on the base substrate, the orthographic projection of the second signal line on the base substrate and the orthographic projection of the third signal line on the base substrate extends in a first direction, the active layer includes a plurality of the first active portions, orthographic projections of the plurality of the first active portions on the base substrate are arranged at intervals along the first direction.

In an exemplary embodiment of the present disclosure, the first conductive portion further includes: a second connection portion connected to each second signal line, wherein an orthographic projection of the second connection portion on the base substrate at least partially overlaps with an orthographic projection of the first functional portion on the base substrate, the second connection portion is connected to the first functional portion through the first via hole.

In an exemplary embodiment of the present disclosure, the first functional portion is an insulating structure, the second conductive layer further includes a third connection portion, the third connection portion is connected to a second electrode of the first transistor, and the third connection portion is connected to the first functional portion through a fourth via hole.

In an exemplary embodiment of the present disclosure, the first transistor is connected between a first signal terminal and a first output terminal, and a gate of the first transistor is connected to a first node, the first transistor is configured to communicate the first signal terminal and the first output terminal in response to a signal of the first node, the first output terminal is configured to provide a gate driving signal to a pixel driving circuit in the display panel.

In an exemplary embodiment of the present disclosure, the first electrode of the first transistor is connected to a first signal terminal, and a second electrode of the first transistor is connected to an first output terminal.

In an exemplary embodiment of the present disclosure, the shift register unit further includes a first capacitor connected between the first node and the first output terminal; the first conductive layer further includes: a first connection portion connected to each first signal line to form a first electrode of the first capacitor; the second conductive layer further includes: a third connection portion connected to each third signal line to form a second electrode of the first capacitor; wherein an orthographic projection of the first connection portion on the base substrate at least partially overlaps with an orthographic projection of the third connection portion on the base substrate.

In an exemplary embodiment of the present disclosure, the first functional portion is a conductor structure; a second electrode of the first transistor is connected to the first signal terminal, and the first electrode of the first transistor is connected to the first output terminal; an orthographic projection of the first functional portion on the base substrate at least partially overlaps with the orthographic projection of the first connection portion on the base substrate.

In an exemplary embodiment of the present disclosure, an orthographic projection of the first functional portion on the base substrate covers an orthographic projection of the first active portion on the base substrate.

In an exemplary embodiment of the present disclosure, a material of the active layer is an oxide semiconductor, and the first transistor is a depletion-type oxide transistor.

According to an aspect of the present disclosure, a display device is provided and includes the above-mentioned display panel.

It should be understood that the preceding general description and the following detailed description are exemplary and explanatory only and are not restrictive of the present disclosure.

BRIEF DESCRIPTION OF THE DRAWINGS

The accompanying drawings here are incorporated in the specification and constitute a part of this specification, show embodiments in accordance with the present disclosure and serve to explain the principles of the present disclosure together with the specification. Obviously, the drawings in the following description are only some embodiments of the present disclosure, and for those ordinary skills in the art, other drawings may also be obtained from these drawings without creative efforts.

DETAILED DESCRIPTION

Figure 1:
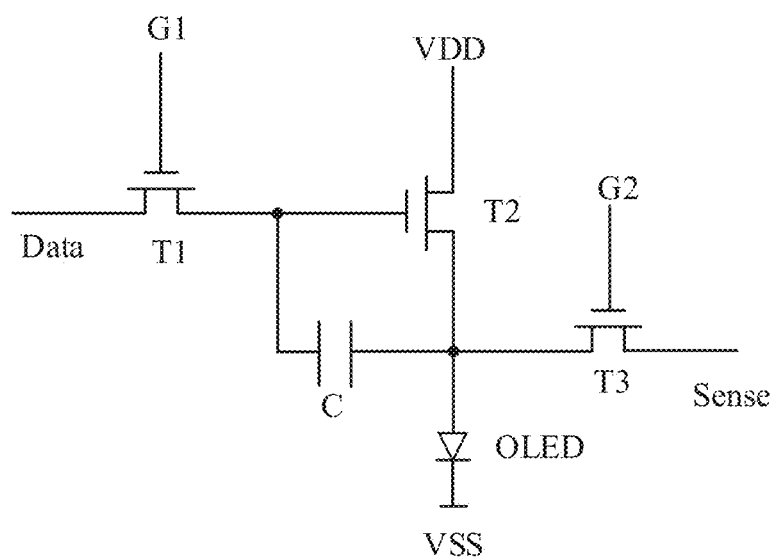
FIG. 1 is a structural view of a pixel driving circuit in the related art.

Exemplary embodiments will now be described more fully with reference to the drawings. However, the exemplary embodiments may be embodied in multiple forms and should not be construed as limited to the examples set forth here; rather, these embodiments are provided such that present disclosure will be more thorough and complete, and will fully convey the concept of exemplary embodiments to those skilled in the art. Same reference numerals in the drawings represent the same or similar structures, and thus their detailed description will be omitted.

Terms such as "one". "an/a", and "said" are used in the specification to indicate the presence of one or more elements/component parts/and others. Terms "including", "including", and "having" have an inclusive meaning which means that there may be additional elements/component parts/and others in addition to the listed elements/component parts/and others.

A structural view of a pixel driving circuit in the related art is shown in FIG. 1. The pixel driving circuit includes a switching transistor T1, a driving transistor T2, a storage capacitor C. and a switching transistor T3. A first electrode of the switching transistor T1 is connected to a data signal terminal Data, and a gate of the switching transistor T1 is connected to a gate driving signal terminal G1. A gate of the driving transistor T2 is connected to a second electrode of the switching transistor T1, a first electrode of the driving transistor T2 is connected to a power signal terminal VDD, a second electrode of the driving transistor T2 is connected to a first electrode of a light-emitting unit OLED, and the other electrode of the light-emitting unit OLED is connected to a second power supply terminal VSS. The storage capacitor C is connected between the gate and the second electrode of the driving transistor T2. A gate of the switching transistor T3 is connected to a gate driving signal terminal G2, a first electrode of the switching transistor T3 is connected to a sensing signal terminal Sense, and a second electrode of the switching transistor T3 is connected to the second electrode of the driving transistor T2. The sensing signal terminal Sense may be configured to sense an output current of the driving transistor T2 when the driving transistor T2 is turned on to detect a threshold voltage and mobility of the driving transistor T2. The pixel driving circuit driving method shown in FIG. 1 generally includes a data writing stage and a light emitting stage. In the data writing stage: the data signal terminal Data inputs a data signal to the gate of the driving transistor T2 through the switching transistor T1 and stores the data signal in the storage capacitor C. The sensing signal terminal Sense may also input an initial signal to a source of the driving transistor T2 through the switching transistor T3. In the light emitting stage: the driving transistor T2 is turned on under the action of the storage capacitor C to drive the light-emitting unit OLED to emit light through the power signal terminal VDD.

Figure 2:
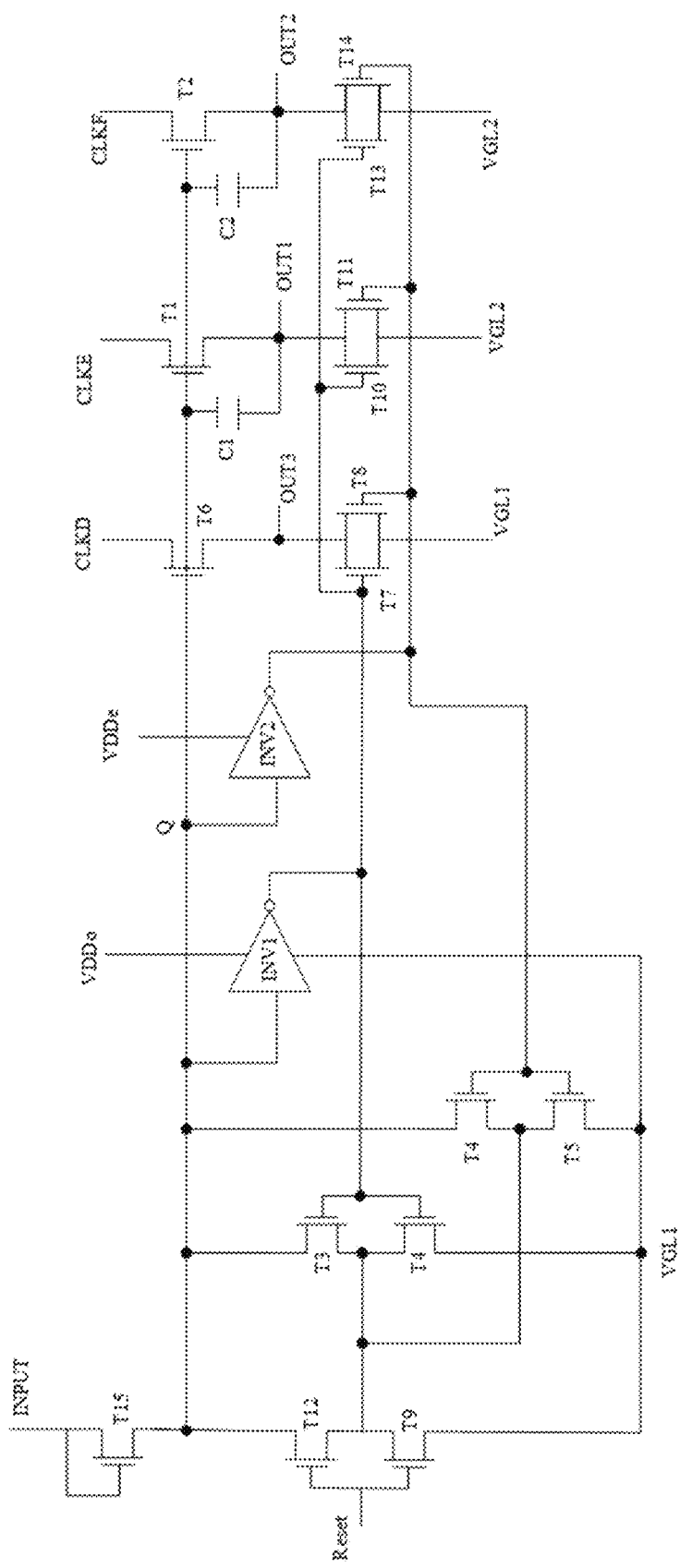
FIG. 2 is an equivalent circuit diagram of a shift register unit in the related art.

An equivalent circuit diagram of a shift register unit in the related art is shown in FIG. 2. The shift register unit may include N-type first transistor T1 to fifteenth transistor T15, an inverter INV1, an inverter INV2, a first capacitor C1, a second capacitor C2, a clock signal terminal CLKD, a clock signal terminal CLKE, a clock signal terminal CLKF, an input signal terminal INPUT, a high-level signal terminal VDDo, a high-level signal terminal VDDe, a low-level signal terminal VGL1, a low-level signal terminal VGL2, a reset signal terminal Reset, a first output terminal OUT1, a second output terminal OUT2 and a third output terminal OUT3. The first output terminal OUT1 may provide a gate driving signal to the gate driving signal terminal G1 in FIG. 1 through a gate line, the second output terminal OUT2 may provide a gate driving signal to the gate driving signal terminal G2 in FIG. 1 through a gate line, and the third output terminal OUT3 may be connected to the input signal terminal INPUT of a next stage shift register unit. In the display panel, the gate line itself has an impedance load (RC loading), especially in a large-sized display panel, the impedance load of the gate line is relatively large. In order to ensure a normal driving of the pixel driving circuit at each position of the display panel, the first transistor T1 and the second transistor T2 in FIG. 2 need to output a larger current. However, the larger current may cause heat accumulation to the display panel, resulting in damage to the display panel. In particular, when the first transistor T1 and the second transistor T2 in FIG. 2 are depletion type oxide transistors, the first transistor T1 and the second transistor T2 are prone to a negative shift of the threshold value due to external light, which further increases on-state currents of the first transistor T1 and the second transistor T2, thereby increasing a risk of burning the display panel.

Figure 3:
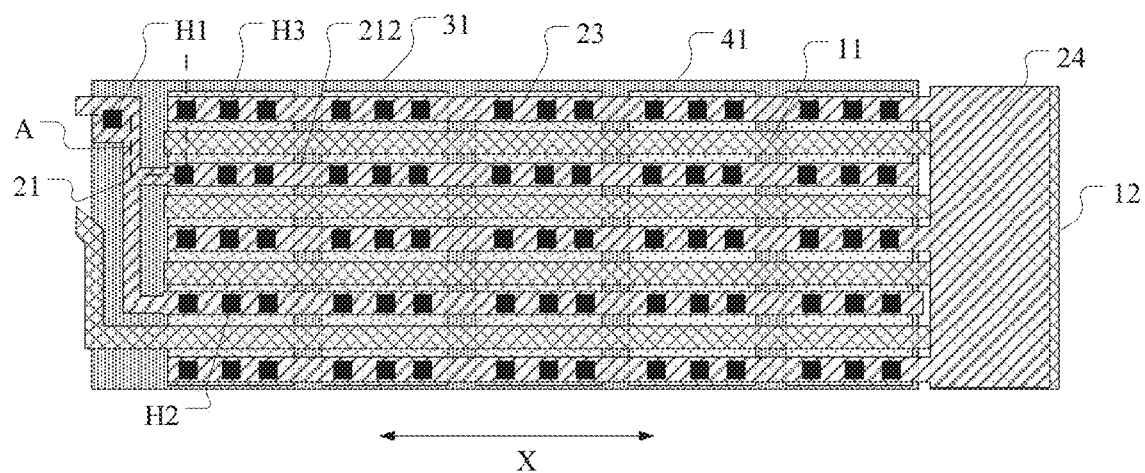
FIG. 3 shows a local layout structure in an exemplary embodiment of a display panel of the present disclosure.
Figure 4:
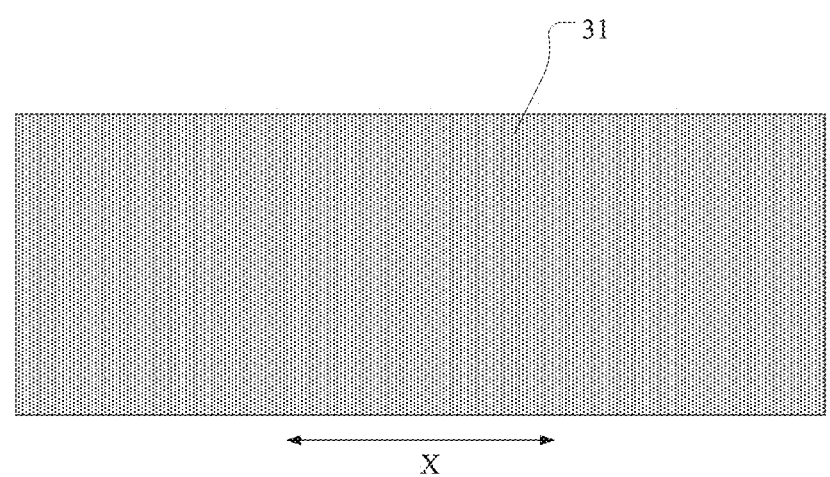
FIG. 4 is a structural layout of a functional layer in FIG. 3.
Figure 5:
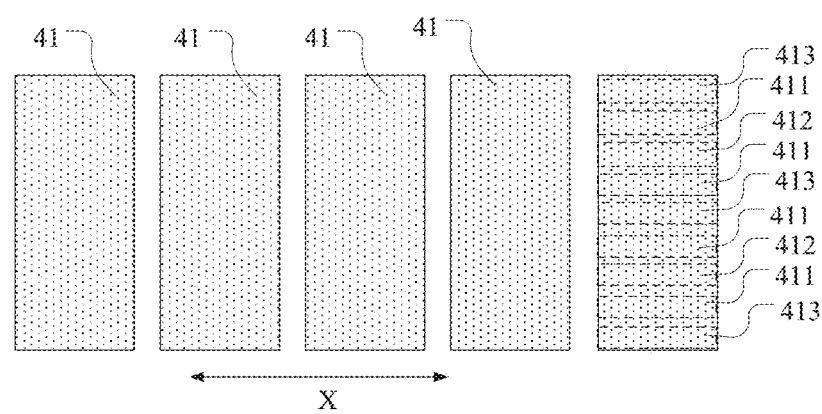
FIG. 5 is a structural layout of an active layer in FIG. 3.
Figure 6:
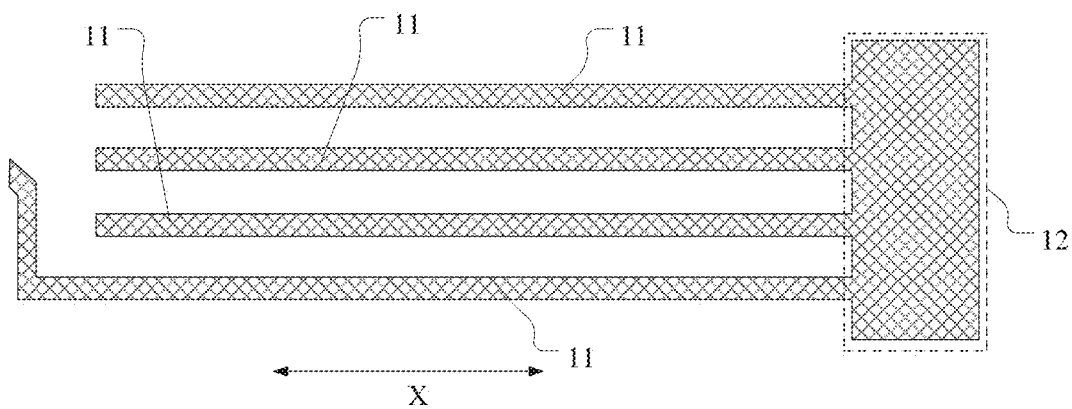
FIG. 6 is a structural layout of a first conductive layer in FIG. 3.
Figure 7:
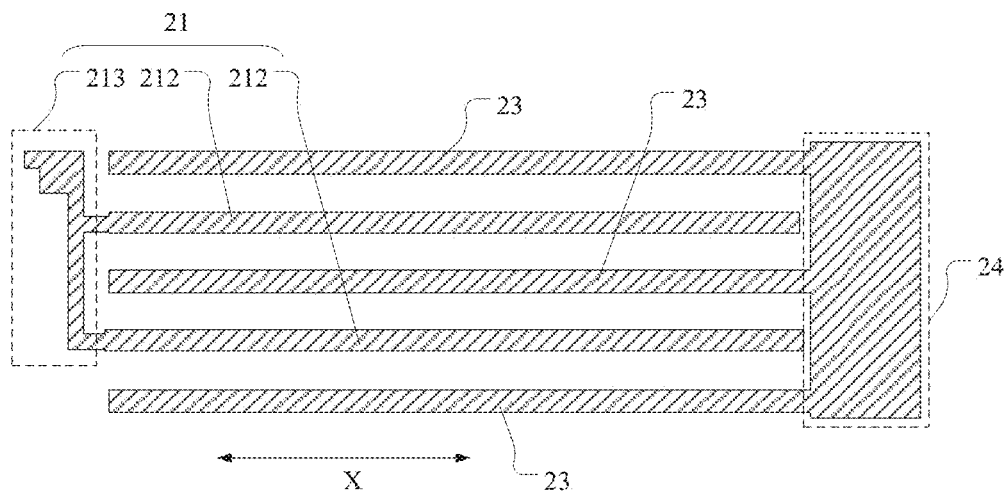
FIG. 7 is a structural layout of a second conductive layer in FIG. 3.
Figure 8:
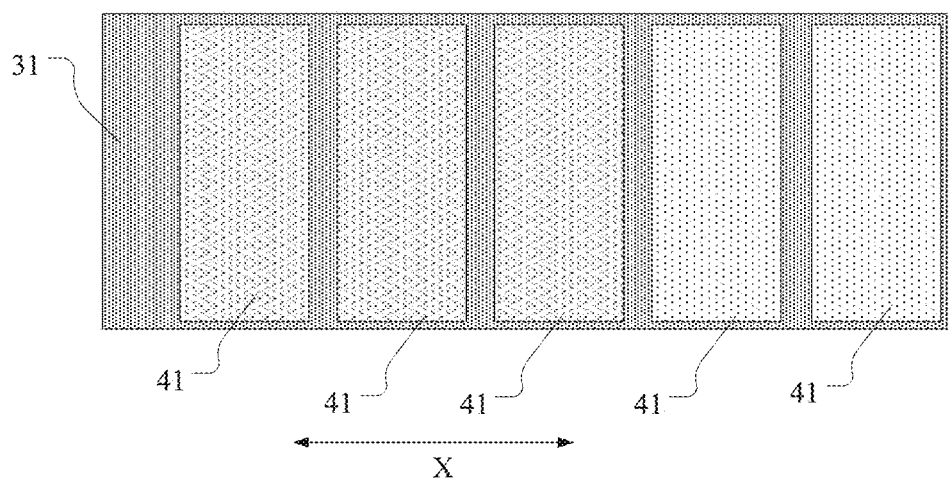
FIG. 8 is a structural layout of the functional layer and the active layer in FIG. 3.
Figure 9:
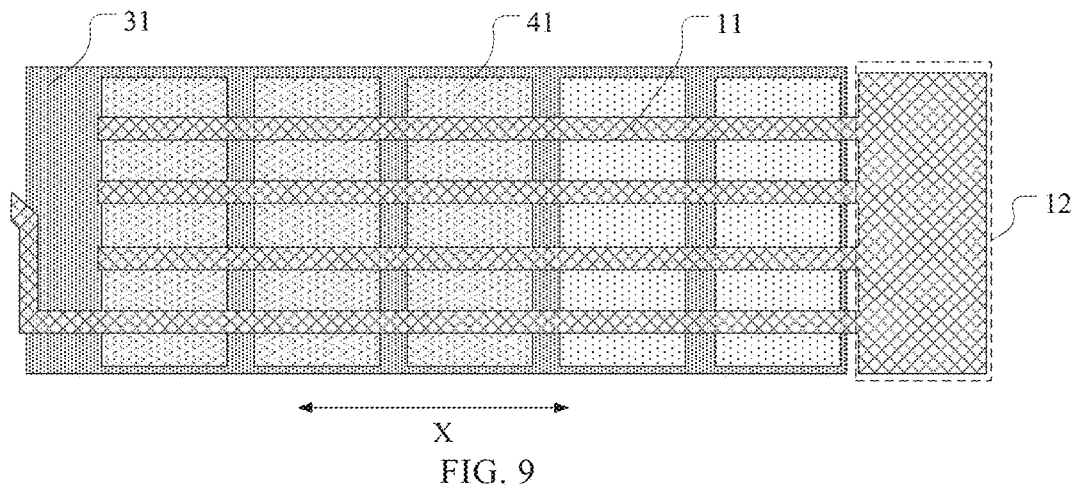
FIG. 9 is a structural layout of the functional layer, the active layer and the first conductive layer in FIG. 3.

Based on this, the present exemplary embodiment provides a display panel, which may include a base substrate, a functional layer, an active layer, a first conductive layer, and a second conductive layer which are sequentially stacked, as shown in FIGS. 3-9. FIG. 3 shows a local layout structure in an exemplary embodiment of a display panel of the present disclosure; FIG. 4 is a structural layout of a functional layer in FIG. 3; FIG. 5 is a structural layout of an active layer in FIG. 3; FIG. 6 is a structural layout of a first conductive layer in FIG. 3; FIG. 7 is a structural layout of a second conductive layer in FIG. 3; FIG. 8 is a structural layout of the functional layer and the active layer in FIG. 3; FIG. 9 is a structural layout of the functional layer, the active layer and the first conductive layer in FIG. 3. The display panel may include a gate driving circuit and a pixel driving circuit, the gate driving circuit may include a plurality of shift register units that are cascaded. The structure of the shift register unit may be shown in FIG. 2, and the structure of the pixel driving circuit may be as shown in FIG. 1. A material of the functional layer may be a thermal conductive material, and the functional layer may include a first functional portion 31. The active layer may include a first active portion 41, the first active portion 41 may include a plurality of first active sub-portions 411, and the first active sub-portions 411 may be configured to form a channel region of the first transistor T1 in FIG. 2, An orthographic projection of the first functional portion 31 on the base substrate may cover an orthographic projection of the first active sub-portion 411 on the base substrate. The second conductive layer may include a first conductive portion 21, and the first conductive portion 21 may be connected to the first electrode of the first transistor T1, and the first conductive portion 21 may be connected to the first functional portion 31 through a first via hole H1.

In the present exemplary embodiment, the functional layer may be a light shielding layer, and that is, the material of the functional layer may be a light shielding material. On the one hand, the first functional portion 31 may shade the first active sub-portion 411 to avoid shift of the threshold value of the first transistor T1, while on the other hand, the first functional portion 31 is connected to the first conductive portion 21 through the via hole H1, such that heat of the first conductive portion 21 may be quickly transferred to the first functional portion 31 through the via hole H1. Moreover, since the first functional portion 31 is closer to the base substrate, the heat of the first conductive portion 21 may be quickly dissipated through the base substrate.

It should be understood that, in other exemplary embodiments, the shift register unit and pixel driving circuit in the display panel may also be of other structures. The gate driving circuit may also provide a gate driving signal to other transistors in the pixel driving circuit. For example, the pixel driving circuit in the display panel may be an internal compensation circuit of 7T1C. The internal compensation circuit of 7T1C may include a switching transistor connected between the power supply terminal and the light-emitting unit, and the gate driving circuit of the present disclosure may provide a gate driving signal to the switching transistor.

In the present exemplary embodiment, as shown in FIGS. 3, 5, 6 and 9, the first active portion 41 may further include a plurality of second active sub-portions 412 and a plurality of third active sub-portions 413, and the second active sub-portion 412 is connected to the third active sub-portion 413 adjacent to the second active sub-portion 412 through one first active sub-portion 411. The first conductive layer may include: a plurality of first signal lines 11 electrically connected to each other, the first signal line 11 and the first active sub-portion 411 are arranged in one-to-one correspondence, and an orthographic projection of the first signal line 11 on the base substrate may cover an orthographic projection of the first active sub-portion 411 on the base substrate, at least partial structure of each first signal line 11 may be configured to form the gate of the first transistor T1. The first conductive portion 21 may include: a plurality of second signal lines 212 electrically connected to each other, the second signal line 212 and the second active sub-portion 412 are arranged in one-to-one correspondence, an orthographic projection of the second signal line 212 on the base substrate covers an orthographic projection of the second active sub-portion 412 corresponding to the second signal line 212 on the base substrate. The second signal line 212 may be connected to the second active sub-portion 412 corresponding to the second signal line 212 through a plurality of second via holes H2. The second conductive layer may further include: a plurality of third signal lines 23 electrically connected to each other, the third signal line 23 and the third active sub-portion 413 are arranged in one-to-one correspondence, and an orthographic projection of the third signal line 23 on the base substrate may cover an orthographic projection of the third active sub-portion 413 corresponding to the third signal line 23 on the base substrate, and the third signal line 23 may be connected to the third active sub-portion 413 corresponding to the third signal line 23 through a plurality of third via holes H3.

The second active sub-portion 412 may form a first electrode of the first transistor T1, and the third active sub-portion 413 may form a second electrode of the first transistor T1. The second signal line 212 may provide the clock signal terminal CLKE in FIG. 2, and the third signal line 23 may provide the first output terminal OUT1 in FIG. 2.

In the present exemplary embodiment, the structure of the first active portion shown in FIG. 5 may form a first transistor with a relatively large channel size in a limited layout space. As shown in FIG. 5, the first active portion may include four first active sub-portions 411, two second active sub-portions 412, and three third active sub-portions 413. The third active sub-portion, the first active sub-portion, the second active sub-portion, the first active sub-portion, the third active sub-portion, the first active sub-portion, the second active sub-portion, the first active sub-portion, and the third active sub-portion may be sequentially connected. It should be understood that in other exemplary embodiments, the first active portion may further include other numbers of first active sub-portions, second active sub-portions, and third active sub-portions. For example, the first active portion may only include one first active sub-portion, one second active sub-portion, and one third active sub-portion. Accordingly, the first signal line has the same number as the first active sub-portion, the second signal line has the same number as the second active sub-portion, and the third signal line has the same number as the third active sub-portion. In addition, the second active sub-portion and the third active sub-portion corresponding to the second active sub-portion may be connected by a plurality of first active sub-portions.

In the present exemplary embodiment, as shown in FIGS. 3 and 7, the orthographic projection of the second signal line 212 on the base substrate and the orthographic projection of the third signal line 23 on the base substrate may extend along a first direction X. The second signal line 212 may be connected to the second active sub-portion 412 corresponding to the second signal line 212 through three second via holes H2, and orthographic projections of the plurality of second via holes H2 on the base substrate may be arranged at intervals along the first direction X. The third signal line 23 may be connected to the third active sub-portion 413 corresponding to the third signal line 23 through a plurality of third via holes H3, and orthographic projections of the plurality of third via holes H3 on the base substrate may be arranged at intervals along the first direction X. It should be understood that in other exemplary embodiments, the second signal line 212 may also be connected to the second active sub-portion 412 corresponding to the second signal line 212 through other number of the second via holes H2, and the third signal line 23 may also be connected to the third active sub-portion 413 corresponding to the third signal line 23 through other number of the third via holes H3, which all fall within the protection scope of the present disclosure.

In the present exemplary embodiment, as shown in FIGS. 3 and 5, the active layer may include a plurality of the first active portions 41, and orthographic projections of the plurality of the first active portions 41 on the base substrate may be arranged at intervals along the first direction X. This arrangement may shunt current flowing through the first transistor through a plurality of first active portions 41, so as to avoid that the current accumulates locally in the active layer and damages the active layer. It should be understood that, in other exemplary embodiments, the plurality of first active portions 41 in FIG. 5 may also be an integral structure.

In the present exemplary embodiment, as shown in FIGS. 3 and 7, the first conductive portion 21 may further include: a second connection portion 213, the second connection portion 213 may be connected to each the second signal line 212, and an orthographic projection of the second connection portion 213 on the base substrate at least partially overlaps with an orthographic projection of the first functional portion 31 on the base substrate, such that the second connection portion 213 may be connected to the first functional portion 31 through the first via hole H1. The orthographic projection of the second connection portion 213 on the base substrate may extend in a direction intersecting with the first direction X.

In the present exemplary embodiment, as shown in FIGS. 3, 6, 7 and 9, the first conductive layer may further include a first connection portion 12, the first connection portion 12 may be connected to each first signal line 11, and the first connection portion 12 may be configured to form a first electrode of the first capacitor C1 in FIG. 2. The second conductive layer may further include a third connection portion 24, and the third connection portion 24 may be connected to each third signal line 23. An orthographic projection of the first connection portion 12 on the base substrate at least partially overlaps with an orthographic projection of the third connection portion 24 on the base substrate, such that the third connection portion 24 may be configured to form a second electrode of the first capacitor C1. It should be noted that the capacitor C in FIG. 2 may also be formed through other structures.

In the present exemplary embodiment, as shown in FIG. 8, an orthographic projection of the first functional portion 31 on the base substrate may cover an orthographic projection of the entire first active portion 41 on the base substrate. This arrangement may set the first functional portion 31 as large an area as possible in a limited space, thereby increasing a heat dissipation rate of the first functional portion 31 to the base substrate. It should be understood that in other exemplary embodiments, the orthographic projection of the first functional portion 31 on the base substrate may also merely cover the orthographic projection of the first active sub-portion 411 on the base substrate.

Figure 10:
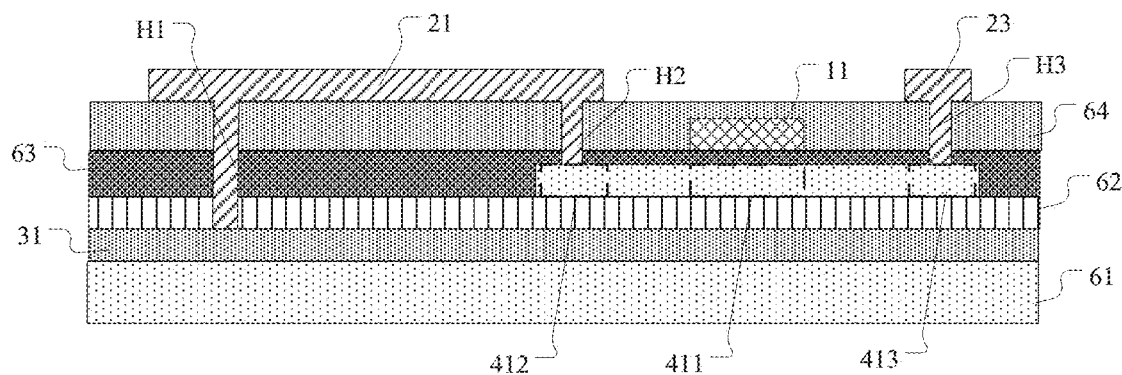
FIG. 10 is a sectional view along a dotted line A in FIG. 3.

A sectional view along a dotted line A in FIG. 3 is shown in FIG. 10. The display panel may further include a buffer layer 62, a gate insulating layer 63, and a dielectric layer 64. The base substrate 61, the functional layer, the buffer layer 62, the active layer, the gate insulating layer, the first conductive layer, the dielectric layer 64, and the second conductive layer are stacked sequentially. The buffer layer 62 may include at least one of a silicon oxide layer and a silicon nitride layer, the gate insulating layer 63 may be a silicon oxide layer, and the dielectric layer 64 may include a silicon oxide layer and a silicon nitride layer. A material of the active layer may be an oxide semiconductor material or a polycrystalline silicon semiconductor material. When the material of the active layer is the oxide semiconductor material, the material of the active layer may be indium gallium zinc oxide. Accordingly, the first transistor may be a depletion type oxide transistor. A material of the first conductive layer may be one of molybdenum, aluminum, copper, titanium, niobium, or an alloy, or molybdenum/titanium alloy or a lamination, and the like. A material of the second conductive layer may include a metal material, such as one of molybdenum, aluminum, copper, titanium, niobium, or an alloy, or molybdenum/titanium alloy or lamination and the like, or titanium/aluminum/titanium lamination. A material of the base substrate 61 may be glass. A material of the functional layer may be a light shielding metal material, such as aluminum, copper, and the like. The display panel may further include a passivation layer located on a side of the second conductive layer away from the base substrate, a planarization layer located on a side of the passivation layer away from the base substrate, an anode layer located on a side of the planarization layer away from the base substrate, and the like.

Figure 11:
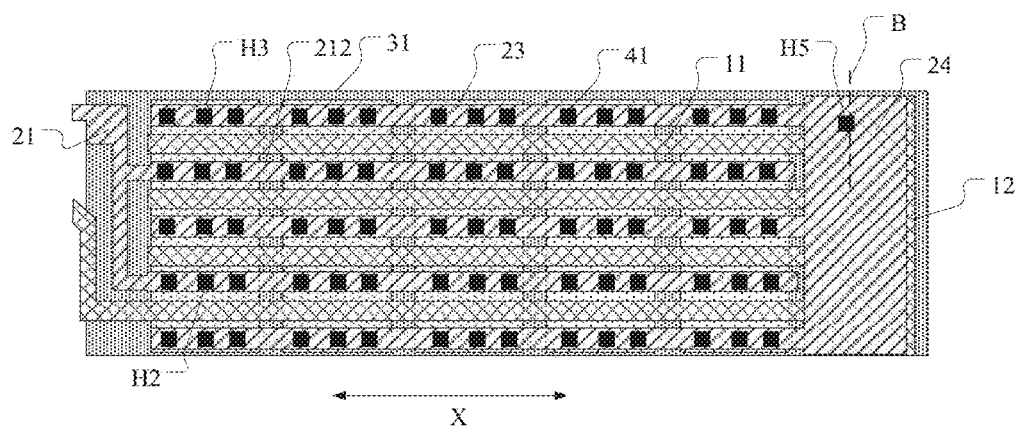
FIG. 11 is a structural layout of a display panel according to another exemplary embodiment of the present disclosure.
Figure 12:
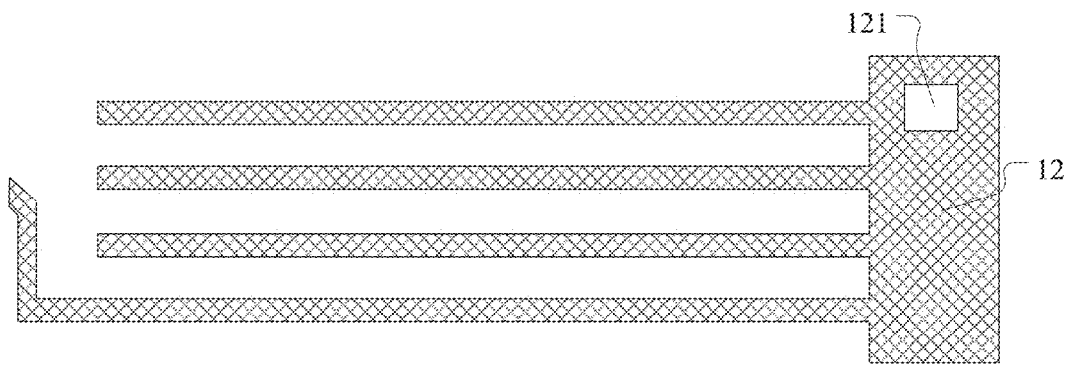
FIG. 12 is a structural layout of a first conductive layer in FIG. 11.
Figure 13:
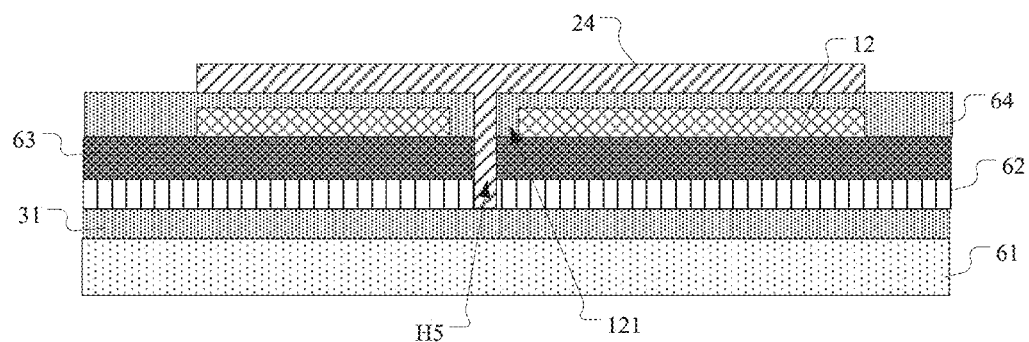
FIG. 13 is a sectional view along a dotted line B in FIG. 11.

As shown in FIGS. 11, 12 and 13, FIG. 11 is a structural layout of a display panel according to another exemplary embodiment of the present disclosure; FIG. 12 is a structural layout of a first conductive layer in FIG. 11; FIG. 13 is a sectional view along a dotted line B in FIG. 11. Different from the display panel shown in FIG. 3, in this display panel, the first conductive portion 21 is not connected to the first functional portion 31 through a via hole, but the third connection portion 24 is connected to the first functional portion 31 through a via hole H5. Accordingly, the first connection portion 12 may be defined with an opening 121, and an orthographic projection of the via hole H5 on the base substrate may be located within an orthographic projection of the opening 121 on the base substrate. That is, a gap is between an edge of the orthographic projection of the via hole H5 and an edge of the orthographic projection of the opening 121, such that a conductor structure of the first functional portion filled in the via hole H5 will not be electrically connected to the first connection portion 12. This arrangement allows heat of the third connection portion 24 to be dissipated quickly through the base substrate. In addition, the orthographic projection of the first functional portion 31 on the base substrate may at least partially overlap with the orthographic projection of the first connection portion 12 on the base substrate, such that a parallel plate capacitor structure may be formed between the first functional portion 31 and the first connection portion 12. This arrangement may increase a capacitor value of the first capacitor C1 in FIG. 2. Other structures of the display panel shown in FIG. 11 may be the same as those shown in FIG. 3.

It should be noted that in the present disclosure, it is recorded that "in an exemplary embodiment of the present disclosure, the first functional portion is a conductor structure; a second electrode of the first transistor is connected to a first signal terminal, and a first electrode of the first transistor is connected to a first output terminal, an orthographic projection of the first functional portion on the base substrate at least partially overlaps with the orthographic projection of the first connection portion on the base substrate", the first connection portion in the present disclosure portion may refer to the third connection portion 24 in FIG. 11.

Figure 14:
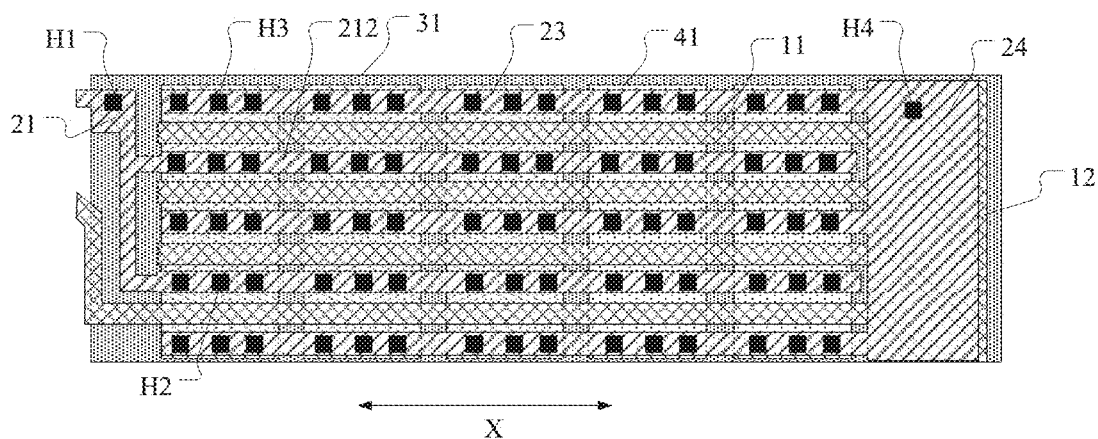
FIG. 14 is a structural layout of a display panel according to another exemplary embodiment of the present disclosure.

A structural layout of a display panel according to another exemplary embodiment of the present disclosure is shown in FIG. 14. Different from the display panel shown in FIG. 3, in this display panel, the first functional portion may be an insulating structure. For example, a material of the first functional portion may be a thermal conductive silica gel material, a thermal conductive silica gel material, and the like. An orthographic projection of the third connection portion 24 may at least partially overlap with an orthographic projection of the first functional portion 31 on the base substrate, and the third connection portion 24 may also be connected to the first functional portion 31 through a fourth via hole H4. This arrangement allows heat of the third connection portion 24 to be dissipated quickly through the base substrate. Accordingly, in the present exemplary embodiment, the structure of the first conductive layer may also be as shown in FIG. 12. Other structures of the display panel shown in FIG. 14 may be the same as those shown in FIG. 3.

In the present exemplary embodiment, the functional layer may further include a functional portion for shielding a channel region of the second transistor T2. The second transistor T2 in FIG. 2 may have the same structure and connection structure as the first transistor T1.

The present exemplary embodiment also provides a display device, which may include the above-mentioned display panel. The display device may be a mobile phone, a tablet computer, TV and other display devices.

After considering the specification and practicing the content disclosed herein, other embodiments of the present disclosure will be apparent to those skilled in the art. The present application is intended to cover any variations, uses, or adaptations of the present disclosure, which follow the general principles of the present disclosure and include common general knowledge or conventional technical means in the art that are not disclosed in the present disclosure. The specification and embodiments are only considered as exemplary, and the true scope and spirit of the present disclosure are pointed out by the claims.

It should be understood that the present disclosure is not limited to the precise structure that has been described above and shown in the drawings, and various modifications and changes may be made without departing from the scope of the present disclosure. The scope of the disclosure is only defined by the appended claims.

What is claimed is:

1. A display panel, comprising:
a gate driving circuit and a pixel driving circuit, wherein the gate driving circuit comprises a plurality of shift register units that are cascaded, the shift register unit comprises a first transistor connected between a first signal terminal and a first output terminal, and a gate of the first transistor is connected to a first node, the first transistor is configured to communicate the first signal terminal and the first output terminal in response to a signal of the first node, the first output terminal is configured to provide a gate driving signal to the pixel driving circuit, wherein the display panel further comprises:
a base substrate;
a functional layer located on a side of the base substrate, wherein a material of the functional layer is a thermal conductive material, and the functional layer comprises a first functional portion;

an active layer located on a side of the functional layer away from the base substrate, wherein the active layer comprises a first active portion, the first active portion comprises at least one first active sub-portion, and the first active sub-portion is configured to form a channel region of the first transistor;

a second conductive layer located on a side of the active layer away from the base substrate, wherein the second conductive layer comprises a first conductive portion, and the first conductive portion is connected to a first electrode of the first transistor and connected to the first functional portion through a first via holes;

wherein the first active portion further comprises at least one second active sub-portion and at least one third active sub-portion, and the second active sub-portion is connected to the third active sub-portion adjacent to the second active sub-portion through the at least one first active sub-portion;

the display panel further comprises a first conductive layer located between the active layer and the second conductive layer, wherein the first conductive layer comprises:
 at least one first signal line electrically connected to each other, wherein the first signal line and the first active sub-portion are arranged in one-to-one correspondence, an orthographic projection of the first signal line on the base substrate covers an orthographic projection of the first active sub-portion corresponding to the first signal line on the base substrate, and at least partial structure of each first signal line is configured to form the gate of the first transistor;

the first conductive portion comprises:
 at least one second signal line electrically connected to each other, wherein the second signal line and the second active sub-portion are arranged in one-to-one correspondence, an orthographic projection of the second signal line on the base substrate covers an orthographic projection of the second active sub-portion corresponding to the second signal line on the base substrate, and the second signal line is connected to the second active sub-portion corresponding to the second signal line through at least one second via hole;

the second conductive layer further comprises:
 at least one third signal line electrically connected to each other, wherein the third signal line and the third active sub-portion are arranged in one-to-one correspondence, an orthographic projection of the third signal line on the base substrate covers an orthographic projection of the third active sub-portion corresponding to the third signal line on the base substrate, and the third signal line is connected to the third active sub-portion corresponding to the third signal line through at least one third via hole.

2. The display panel according to claim 1, wherein the material of the functional layer is a light shielding material;
an orthographic projection of the first functional portion on the base substrate covers an orthographic projection of the first active sub-portion on the base substrate.

3. The display panel according to claim 1, wherein the first active portion comprises a plurality of the first active sub-portions.

4. The display panel according, to claim 3, wherein the first active portion comprises four first active sub-portions, two second active sub-portions, and three third active sub-portions; the third active sub-portion, the first active sub-portion, the second active sub-portion, the first active sub-portion, the third active sub-portion, the first active sub-portion, the second active sub-portion, the first active sub-portion, and the third active sub-portion are sequentially connected.

5. The display panel according to claim 1, wherein the orthographic projection of the second signal line on the base substrate and the orthographic projection of the third signal line on the base substrate extend in a first direction;
 the second signal line is connected to the second active sub-portion corresponding to the second signal line through a plurality of second via holes, and orthographic projections of the plurality of second via holes on the base substrate are arranged at intervals along the first direction; and
 the third signal line is connected to the third active sub-portion corresponding to the third signal line through a plurality of third via holes, and orthographic projections of the plurality of third via holes on the base substrate are arranged at intervals along the first direction.

6. The display panel according to claim 1, wherein the active layer comprises a plurality of the first active portions, orthographic projections of the plurality of the first active portions on the base substrate are arranged at intervals, and the first active sub-portions in different first active portions are connected in parallel in a circuit where the first transistor is located.

7. The display panel according to claim 1, wherein the first conductive portion further comprises:
 a second connection portion connected to each second signal line, wherein an orthographic projection of the second connection portion on the base substrate at least partially overlaps with an orthographic projection of the first functional portion on the base substrate, the second connection portion is connected to the first functional portion through the first via hole.

8. The display panel according to claim 1, wherein the first functional portion is an insulating structure, the second conductive layer further comprises a third connection portion, the third connection portion is connected to a second electrode of the first transistor, and the third connection portion is connected to the first functional portion through a fourth via hole.

9. The display panel according to claim 1, wherein the first electrode of the first transistor is connected to the first signal terminal, and a second electrode of the first transistor is connected to the first output terminal.

10. The display panel according to claim 1, wherein the shift register unit further comprises a first capacitor connected between the first node and the first output terminal;
 the first conductive layer further comprises:
  a first connection portion connected to each first signal line to form a first electrode of the first capacitor;
 the second conductive layer further comprises:
  a third connection portion connected to each third signal line to form a second electrode of the first capacitor;
 wherein an orthographic projection of the first connection portion on the base substrate at least partially overlaps with an orthographic projection of the third connection portion on the base substrate.

11. The display panel according to claim 10, wherein the first functional portion is a conductor structure;

a second electrode of the first transistor is connected to the first signal terminal, and the first electrode of the first transistor is connected to the first output terminal;
an orthographic projection of the first functional portion on the base substrate at least partially overlaps with the orthographic projection of the first connection portion on the base substrate.

12. The display panel according to claim 1, wherein an orthographic projection of the first functional portion on the base substrate covers an orthographic projection of the first active portion on the base substrate.

13. The display panel according to claim 1, wherein a material of the active layer is an oxide semiconductor, and the first transistor is a depletion-type oxide transistor.

14. A display device, comprising:
a display panel,
wherein the display panel comprises:
a gate driving circuit and a pixel driving circuit;
the gate driving circuit comprises a plurality of shift register units that are cascaded, the shift register unit comprises a first transistor connected between a first signal terminal and a first output terminal, and a gate of the first transistor is connected to a first node, the first transistor is configured to communicate the first signal terminal and the first output terminal in response to a signal of the first node, the first output terminal is configured to provide a gate driving signal to the pixel driving circuit,
a base substrate;
a functional layer located on a side of the base substrate, wherein a material of the functional layer is a thermal conductive material, and the functional layer comprises a first functional portion;
an active layer located on a side of the functional layer away from the base substrate, wherein the active layer comprises a first active portion, the first active portion comprises at least one first active sub-portion, and the first active sub-portion is configured to form a channel region of the first transistor;
a second conductive layer located on a side of the active layer away from the base substrate, wherein the second conductive layer comprises a first conductive portion, and the first conductive portion is connected to a first electrode of the first transistor and connected to the first functional portion through a first via holes;
wherein the first active portion further comprises at least one second active sub-portion and at least one third active sub-portion, and the second active sub-portion is connected to the third active sub-portion adjacent to the second active sub-portion through the at least one first active sub-portion;
the display panel further comprises a first conductive layer located between the active layer and the second conductive layer,
wherein the first conductive layer comprises:
at least one first signal line electrically connected to each other, wherein the first signal line and the first active sub-portion are arranged in one-to-one correspondence, an orthographic projection of the first signal line on the base substrate covers an orthographic projection of the first active sub-portion corresponding to the first signal line on the base substrate, and at least partial structure of each first signal line is configured to form the gate of the first transistor;
the first conductive portion comprises:
at least one second signal line electrically connected to each other, wherein the second signal line and the second active sub-portion are arranged in one-to-one correspondence, an orthographic projection of the second signal line on the base substrate covers an orthographic projection of the second active sub-portion corresponding to the second signal line on the base substrate, and the second signal line is connected to the second active sub-portion corresponding to the second signal line through at least one second via hole;
the second conductive layer further comprises:
at least one third signal line electrically connected to each other, wherein the third signal line and the third active sub-portion are arranged in one-to-one correspondence, an orthographic projection of the third signal line on the base substrate covers an orthographic projection of the third active sub-portion corresponding to the third signal line on the base substrate, and the third signal line is connected to the third active sub-portion corresponding to the third signal line through at least one third via hole.

15. The display device according to claim 14, wherein the material of the functional layer is a light shielding material;
an orthographic projection of the first functional portion on the base substrate covers an orthographic projection of the first active sub-portion on the base substrate.

16. The display device according to claim 14, wherein the first active portion comprises a plurality of the first active sub-portions.

17. The display device according to claim 16, wherein the first active portion comprises four first active sub-portions, two second active sub-portions, and three third active sub-portions; the third active sub-portion, the first active sub-portion, the second active sub-portion, the first active sub-portion, the third active sub-portion, the first active sub-portion, the second active sub-portion, the first active sub-portion, and the third active sub-portion are sequentially connected.

18. The display device according to claim 14, wherein the orthographic projection of the second signal line on the base substrate and the orthographic projection of the third signal line on the base substrate extend in a first direction;
the second signal line is connected to the second active sub-portion corresponding to the second signal line through a plurality of second via holes, and orthographic projections of the plurality of second via holes on the base substrate are arranged at intervals along the first direction; and
the third signal line is connected to the third active sub-portion corresponding to the third signal line through a plurality of third via holes, and orthographic projections of the plurality of third via holes on the base substrate are arranged at intervals along the first direction.

* * * * *